(12) United States Patent
Kim et al.

(10) Patent No.: US 7,062,390 B2
(45) Date of Patent: Jun. 13, 2006

(54) METHOD FOR EVALUATING CAPACITY OF SECONDARY BATTERY USING MATHEMATICAL CALCULATION OF SPECIFIC RESISTANCE COMPONENTS OF EQUIVALENT CIRCUIT MODEL FITTED FROM IMPEDANCE SPECTRUM

(75) Inventors: Dong-Hwan Kim, Daejeon (KR); Sang-Hyo Ryu, Daejeon (KR); Hyung-Song Lee, Daejeon (KR)

(73) Assignee: Korea Kumho Petrochemical Co. (KR)

( * ) Notice: Subject to any disclaimer, the term of this patent is extended or adjusted under 35 U.S.C. 154(b) by 0 days.

(21) Appl. No.: 10/612,080

(22) Filed: Jul. 1, 2003

(65) Prior Publication Data

US 2004/0006440 A1     Jan. 8, 2004

(30) Foreign Application Priority Data

Jul. 2, 2002    (KR) ............... 10-2002-0038004

(51) Int. Cl.
*G01N 27/416* (2006.01)

(52) U.S. Cl. .................. 702/63; 320/132; 324/430

(58) Field of Classification Search ................ 320/161, 320/132, 127–129, 135, 156, 157, 160, 162, 320/164; 324/427, 430, 432, 433; 702/63; 429/120, 176, 212, 221, 224, 247, 304, 331, 429/332, 338, 339, 341, 231.3
See application file for complete search history.

(56) References Cited

U.S. PATENT DOCUMENTS

| 3,562,634 | A |   | 2/1971  | Latner |
|---|---|---|---|---|
| 3,984,762 | A |   | 10/1976 | Dowgiallo, Jr. |
| 4,678,998 | A |   | 7/1987  | Muramatsu |
| 4,681,823 | A | * | 7/1987  | Tung et al. ............... 429/231.7 |
| 4,743,855 | A |   | 5/1988  | Randin et al. |
| 4,952,862 | A |   | 8/1990  | Biagetti et al. |
| 5,241,275 | A |   | 8/1993  | Fang |
| 5,714,280 | A | * | 2/1998  | Nakano et al. ............. 429/332 |
| 5,939,864 | A | * | 8/1999  | Lenhart et al. ............. 320/137 |
| 5,998,052 | A | * | 12/1999 | Yamin ........................... 429/9 |
| 6,118,275 | A | * | 9/2000  | Yoon et al. .................. 324/427 |
| 6,160,382 | A | * | 12/2000 | Yoon et al. .................. 320/136 |
| 6,208,147 | B1 | * | 3/2001  | Yoon et al. .................. 324/430 |

(Continued)

FOREIGN PATENT DOCUMENTS

EP     A1 0119547     7/1984

OTHER PUBLICATIONS

Barsoukov et al., "Universal battery parameterization to yield an non-linear equivalent circuit valid for battery simulation at arbitrary load", Journal of Power Sources, 83, p. 61-70 (1999).

*Primary Examiner*—Carol S. W. Tsai
(74) *Attorney, Agent, or Firm*—Dilworth & Barrese LLP

(57) ABSTRACT

The present invention relates to a method for evaluating an initial capacity of secondary batteries and, more specifically, to a method for evaluating an initial capacity of secondary batteries that involves mathematical operation of specific internal resistance components obtained from an equivalent circuit model of an impedance spectrum measured for a short time period instead of using direct discharge characteristics, thereby allowing selection of batteries having a different initial discharge characteristic.

12 Claims, 6 Drawing Sheets

U.S. PATENT DOCUMENTS

| | | | |
|---|---|---|---|
| 6,469,471 B1* | 10/2002 | Anbuky et al. | 320/118 |
| 6,509,122 B1* | 1/2003 | Oyama | 429/303 |
| 6,566,015 B1* | 5/2003 | Yamada et al. | 429/326 |
| 6,832,171 B1* | 12/2004 | Barsoukov et al. | 702/65 |
| 2002/0014879 A1* | 2/2002 | Koike et al. | 320/133 |
| 2002/0060554 A1* | 5/2002 | Odaohhara et al. | 320/134 |
| 2003/0082458 A1* | 5/2003 | Oyama | 429/303 |
| 2003/0124423 A1* | 7/2003 | Sasaki et al. | 429/221 |
| 2003/0184307 A1* | 10/2003 | Kozlowski et al. | 324/427 |
| 2004/0021448 A1* | 2/2004 | Bluemel et al. | 322/44 |

* cited by examiner

METHOD FOR EVALUATING CAPACITY OF SECONDARY BATTERY USING MATHEMATICAL CALCULATION OF SPECIFIC RESISTANCE COMPONENTS OF EQUIVALENT CIRCUIT MODEL FITTED FROM IMPEDANCE SPECTRUM

BACKGROUND OF THE INVENTION

1. The Field of the Invention

The present invention relates to a method for evaluating an initial capacity of secondary batteries and, more specifically, to a method for evaluating an initial capacity of secondary batteries that involves mathematical operation of specific internal resistance components obtained from an equivalent circuit model of an impedance spectrum measured for a short time period instead of using direct discharge characteristics, thereby allowing selection of batteries having a different initial discharge characteristic.

2. Related Prior Art

As the electronic appliances, office supplies and mobile communication equipment are increasingly required to be more light-weigh and portable in recent years, it is necessary to manufacture secondary batteries used as a driving power source for those products in a miniaturized, light-weight and high-energy compacted way.

Among the secondary batteries, the lithium-ion secondary batteries that are designed to have a high battery voltage of 3 to 4 V and a high energy density of 100 Wh/kg and reversible in insertion and release have been developed to have a battery capacity increased from 0.6 Ah level to 2 Ah level. The lithium-ion secondary batteries are commercially available in various forms, rectangular, cylindrical or the like, according to the demand on the market. These high-capacity batteries are in an increasing demand and expected to be a principal energy source for transmission of picture information in the future, as the recent mobile communication terminals are turned into multimedia devices. Typically, the high-capacity batteries are used in the form of a single-unit battery (for appliances having a single battery as a power source) or a multi-unit battery group (i.e., a battery pack including multiple battery units in serial, parallel, or serial-parallel arrangement). In the case of the multi-unit battery group, the evaluation of capacity for batteries is of a great significance. It is known that the battery manufacturers evaluate the capacity of batteries by comparing impedance measurements at a specific frequency and a charge/discharge test repeatedly performed with a predetermined frequency.

Conventionally, the methods for measuring the capacity of batteries involve measuring the impedance of the batteries at a specific frequency or examining the state of charge/discharge of the batteries.

U.S. Pat. No. 3,562,634 discloses a method for determining the state of charge of Ni—Cd secondary batteries from the Faraday capacity measured using a bridge. According to this reference document, the correlation between the internal impedance of the battery at a specific frequency and the battery capacity is dependent on the impedance response characteristic of the chemical material used as an active material of the battery. So this method is not applicable to all kinds of batteries for capacity measurement.

Another method of measuring the internal impedance of batteries that is more generally used is disclosed in U.S. Pat. No. 4,678,998, in which the state of the batteries can be determined from the correlation between the internal impedance value at a specific frequency and the battery capacity. This method monitors the state of the batteries in a vehicle in a continuous manner and comparing impedance values measured at the respective frequencies.

Besides, U.S. Pat. No. 4,743,855 discloses a method using two complex impedance values measured in low and high frequency regions, respectively, and U.S. Pat. No. 5,241,275 discloses a method using a linear impedance characteristic in the low frequency region. Also, a method using the correlation between the impedance value at a specific frequency or in a specific frequency region and the capacity of the battery hardly guarantees the efficiency of measurement and the precision of the correlation.

The latter method has a problem in the aspect of time and economy in evaluating the capacity of numerous batteries using charge/discharge equipment.

The general methods for determining the state of charge/discharge of batteries involve measurements of the open circuit voltage, the battery voltage and variations in the operation mode, the characteristic of output signals for an input voltage or current applied to the batteries and an internal resistance function or an impedance function derived from the characteristics. The use of these methods allows a measurement of the battery capacity in a shorter time period than a required time for a real-time discharge method. For this purpose, many studies have been made. For example, U.S. Pat. No. 4,952,862 discloses a method for calculating a residual capacity of batteries that involves expressing the discharge characteristic of the batteries as a voltage-time function consisting of Peukert parameters and calculating the residual capacity of the batteries from the voltage measurement of the batteries and the voltage-time function. EP No. 119,547 also suggests a method for measuring the discharge voltage of batteries during a discharge as a function of time and then determining the state of discharge of the batteries from the average variation of the discharge voltage in a predefined interval. U.S. Pat. No. 3,984,762 discloses a method for measuring a phase difference between an AC applied to a battery and a measured AC voltage. In the case of calculating the capacity by measuring a voltage or a voltage change in the course of a discharge, the precision of the correlation between the measured value and the capacity is dependent on the discharge characteristic of the battery. For example, this method cannot be applied to lithium-ion secondary batteries, which exhibit uniformity of voltage and manufactured are in the same conditions, because the voltage change of the batteries is so insignificant with respect to the change of the state of discharge.

SUMMARY OF THE INVENTION

It is an object of the present invention to solve the problem with the conventional method of evaluating an initial capacity of secondary batteries produced in the same manufacturing conditions and to provide a method for selecting batteries having a different initial discharge characteristic by mathematical operation of the internal resistance components obtained from an equivalent circuit model of an impedance spectrum measured for a short time period instead of using direct discharge characteristics.

To achieve the above object of the present invention, there is provided a method for evaluating an initial discharge capacity of secondary batteries that includes: preparing batteries having a specific state of charge (SOC) or a specific depth of discharge (DOD); measuring an impedance spectrum of the batteries; mathematically operating specific internal resistance components obtained from an equivalent circuit model of the impedance spectrum; and comparing the mathematical operation value of the resistance components with the initial discharge capacity of the batteries and evaluating the initial discharge capacity of an unknown battery of the same group.

Hereinafter, the present invention will be described in detail with reference to the accompanying drawings.

FIG. 1 shows the correlation between the initial capacity distribution of batteries of a same group used for evaluating the capacity of secondary batteries and a voltage drop with different open circuit voltages (OCV). In the figure, the voltage drop increases as the battery group has a lower capacity and the voltage drop distribution increases with an increase in the charging voltage. This information of the voltage drop after a charge can be applied as useful information for evaluating the capacity of the batteries. But the capacity of batteries cannot be readily evaluated only with the voltage drop for batteries of a same group that have a capacity difference of about less then 5%. According to U.S. Pat. No. 6,208,147, the measurement of battery capacity by analysis of impedance spectrum is based on the fact that the impedance spectrum characteristic to the DOD of the battery is related to the residual capacity of the battery. Especially, the capacity correlation acquired from the impedance spectrum of batteries of a same group appears in a specific measurement condition for the impedance spectrum. Namely, the resistance components of an equivalent circuit model fitted from the impedance spectrum measured for batteries charged with a charge capacity of at least 50%, preferably at least 60%, or discharged with a discharge capacity of less than 10% from a voltage less than a full charge voltage are sensitive to the capacity change in the batteries of the same group. The method for evaluating an initial capacity of batteries of a same group by mathematically operating specific internal resistance components of the batteries has been contrived based on the fact that mathematical operation value of the two resistance components has a high correlation with the initial capacity of the batteries of a same group.

The battery manufacturer releases secondary batteries according to the capacity distribution required by the battery purchasers. For evaluating an initial capacity of batteries of a same group by a mathematical operation of specific internal resistance components obtained from the impedance spectrum measurement without using a repeated real-time discharge method, it is necessary to maintain the batteries in the state of charge with a charge capacity of at least 50%, preferably at least 60%, of the expected nominal discharge capacity or in the state of discharge with a discharge capacity of less than 20% from a voltage less than the full charge voltage, after the formation process of assembled batteries. In this case, the batteries are required to be in the same state of charge (SOC) in the condition that the open circuit voltage (OCV) change caused by a one-day self-discharge does not exceed 20 mV. The time required for measurement of the impedance spectrum for batteries of a same group is determined by the minimum frequency value, and the measurement is performed in the frequency range of 10 kHz to 1 mHz, preferably 1 kHz to 10 mHz. The equivalent circuit model fitted from the impedance spectrum measured is the general circuit model disclosed in Universal Battery Parameterization To Yield A Non-linear Equivalent Circuit Valid For Battery Simulation At Arbitrary Load(J. Power Sources, 83 (1999) 61). Among the resistance components obtainable from the equivalent circuit model, the $R_{ser}$ (resistance of separator and current collectors) resistance component related to a degradation of electrolyte, separators and current collectors and the $R_{ct}$ (charge transfer resistance) component are subjected to multiplication operation to make up a capacity correlation graph of which the X-axis represents the initial discharge capacity and Y-axis represents the resulting operation value. The operation method for the X-axis is not limited to the mathematical multiplication operation. With the capacity correlation graph prepared for batteries, the batteries of the same group can be readily and economically selected with respect to a specific initial capacity without using a repeated real-time discharge method.

In addition, the battery pack manufacturers supplied with batteries in a specific state of charge or discharge can acquire accurate information for evaluation of the battery capacity only through an analysis of the impedance spectrum, thereby having a chance to enhance the energy efficiency of the battery pack.

DETAILED DESCRIPTION OF THE INVENTION

Hereinafter, the present invention will be described in detail by way of the following examples, which are not intended to limit the scope of the present invention.

EXAMPLE 1

Figure 1:
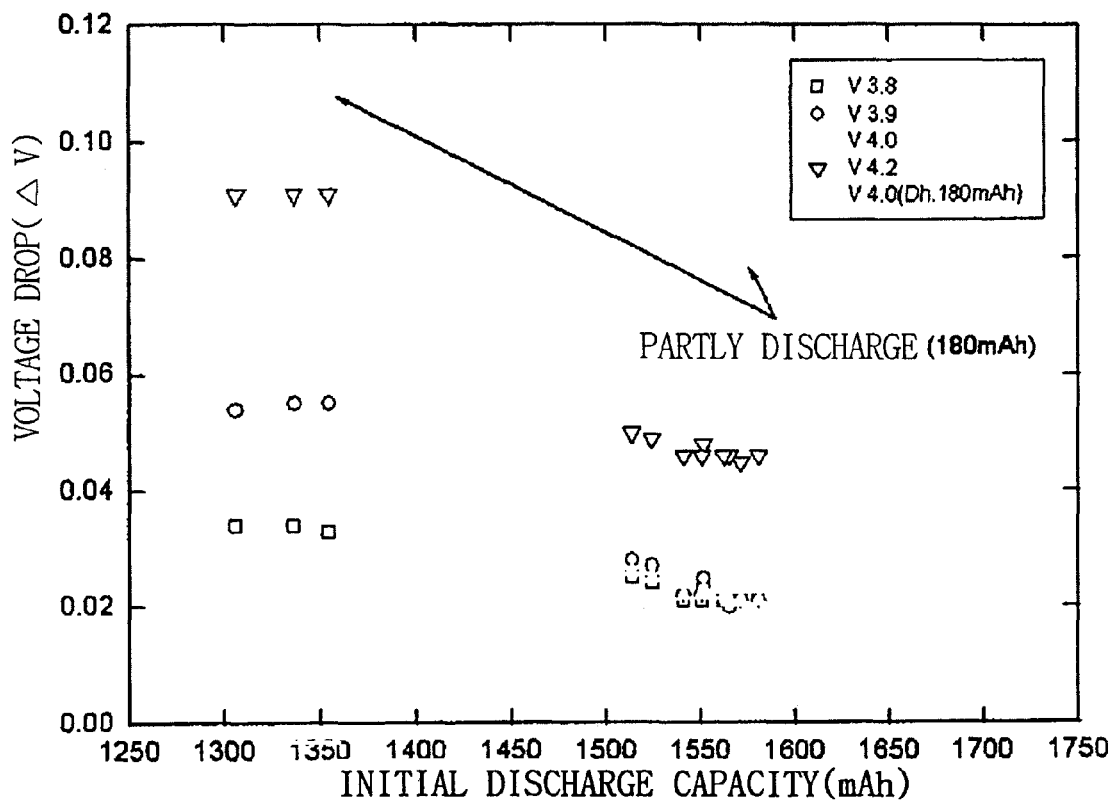
FIG. 1 is a graph showing the correlation between a voltage drop and a battery capacity with different open circuit voltages of a same battery group according to an embodiment of the present invention.
Figure 2:
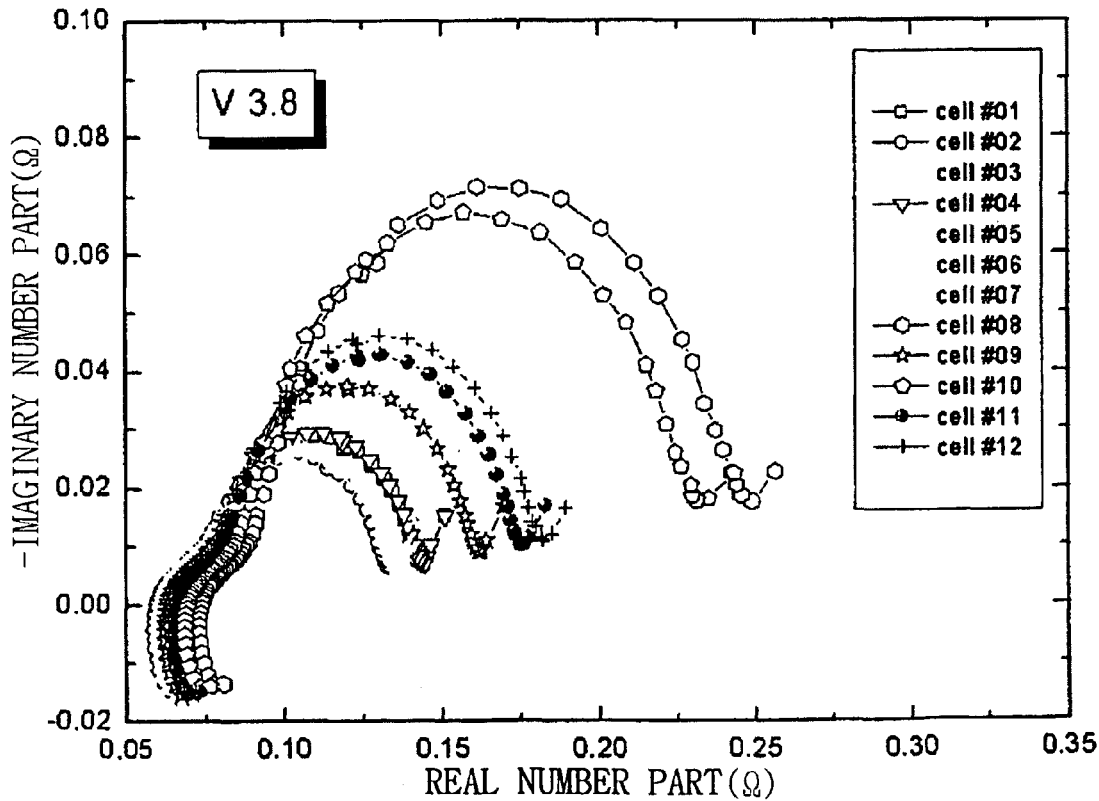
FIG. 2 is a graph showing an impedance spectrum at a charging voltage of 3.8 V according to an embodiment of the present invention.
Figure 3:
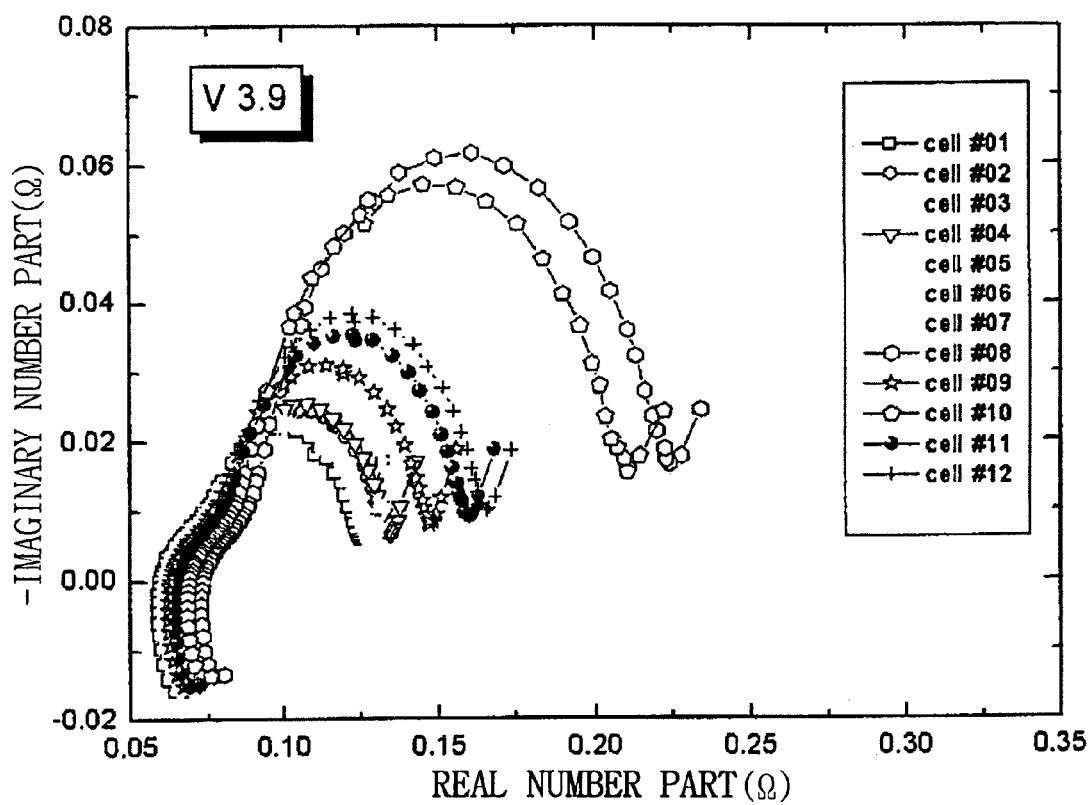
FIG. 3 is a graph showing an impedance spectrum at a charging voltage of 3.9 V according to an embodiment of the present invention.
Figure 4:
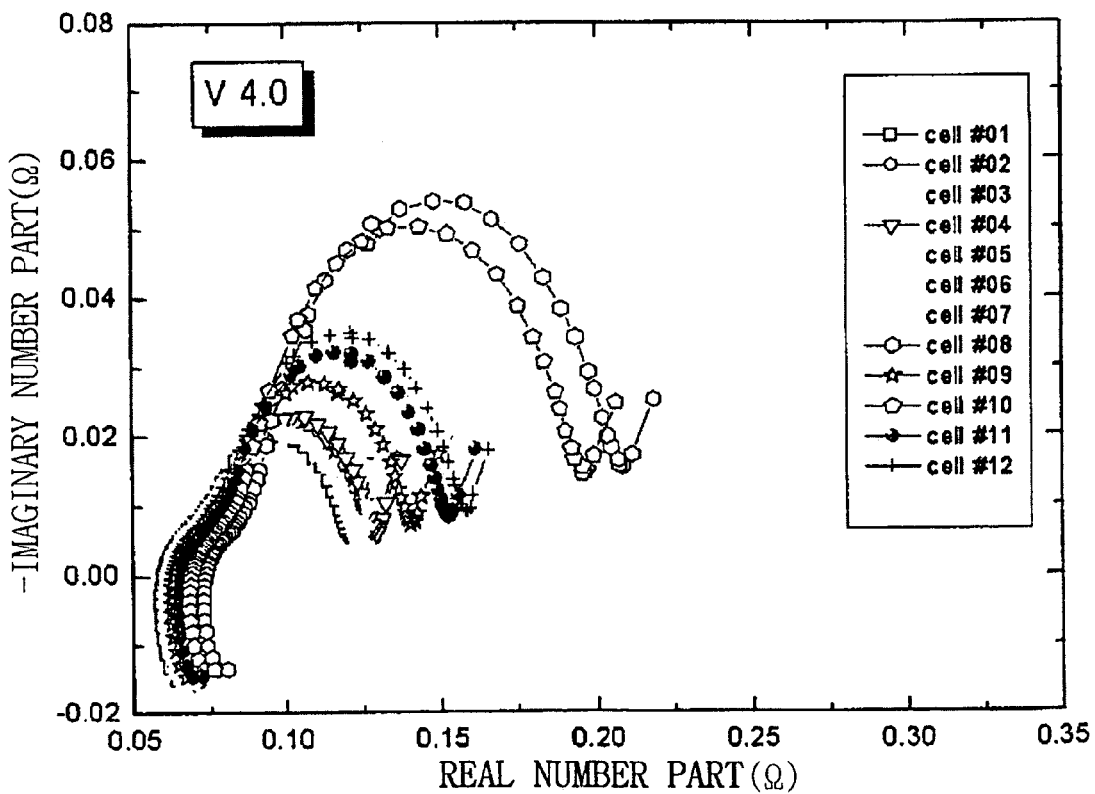
FIG. 4 is a graph showing an impedance spectrum at a charging voltage of 4.0 V according to an embodiment of the present invention.
Figure 5:
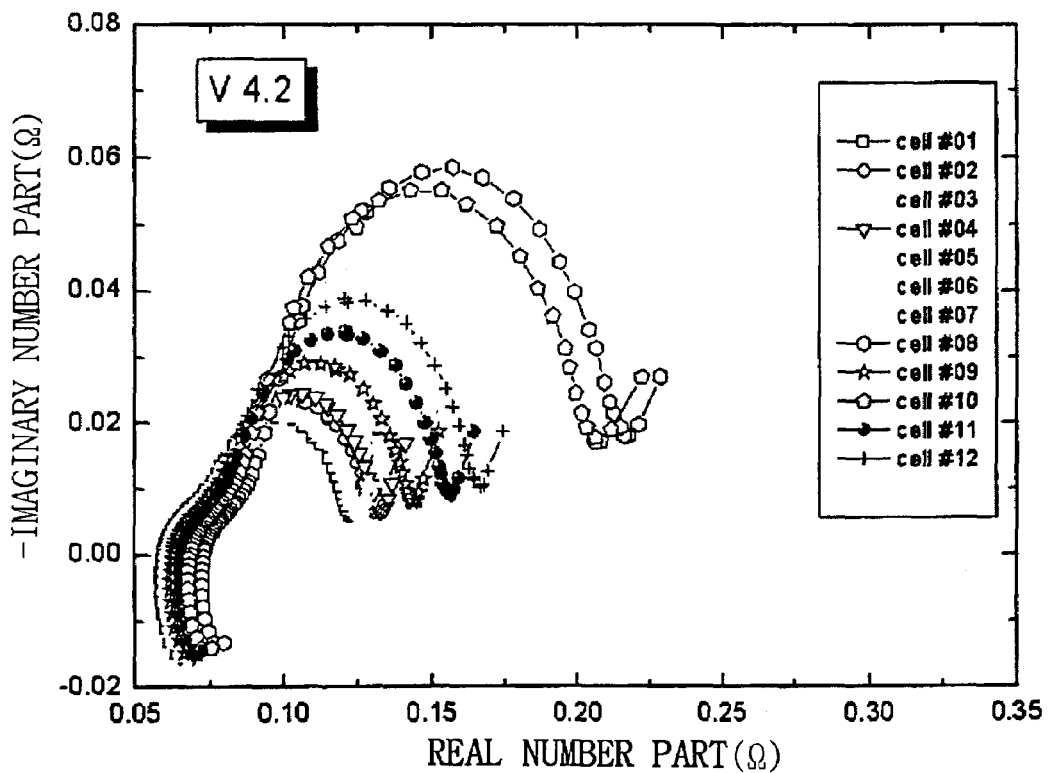
FIG. 5 is a graph showing an impedance spectrum at a charging voltage of 4.2 V according to an embodiment of the present invention.
Figure 6:
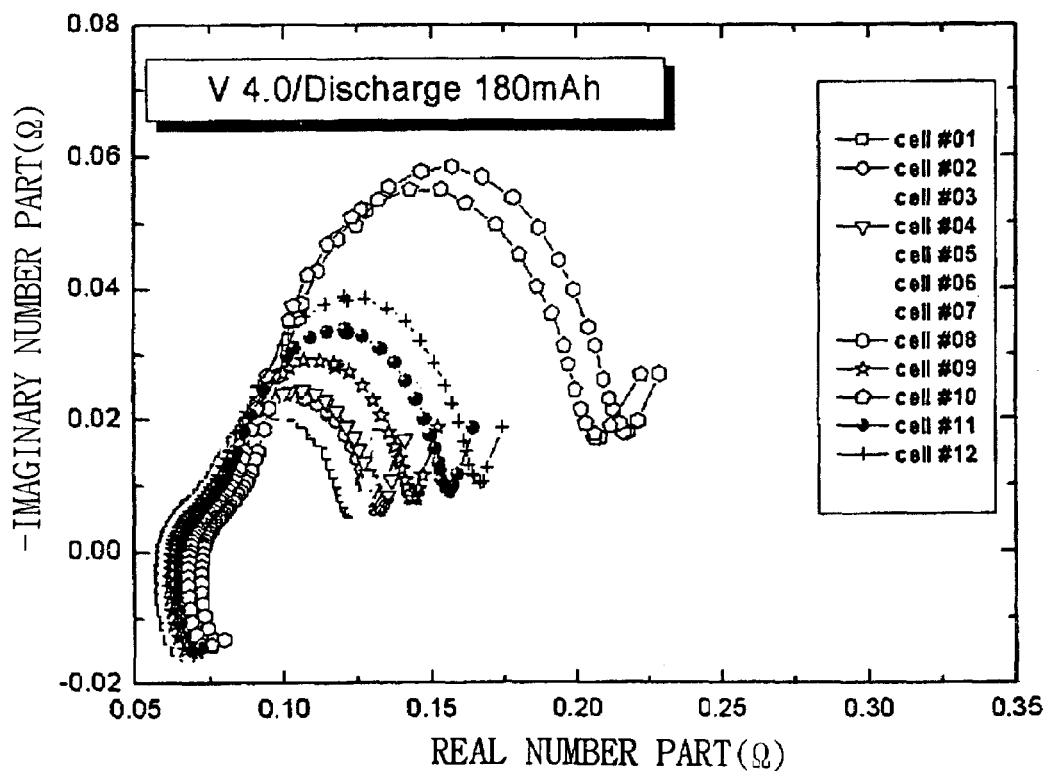
FIG. 6 is a graph showing an impedance spectrum measured after discharging a charging voltage of 4.0 V by 180 mAh according to an embodiment of the present invention.
Figure 7:
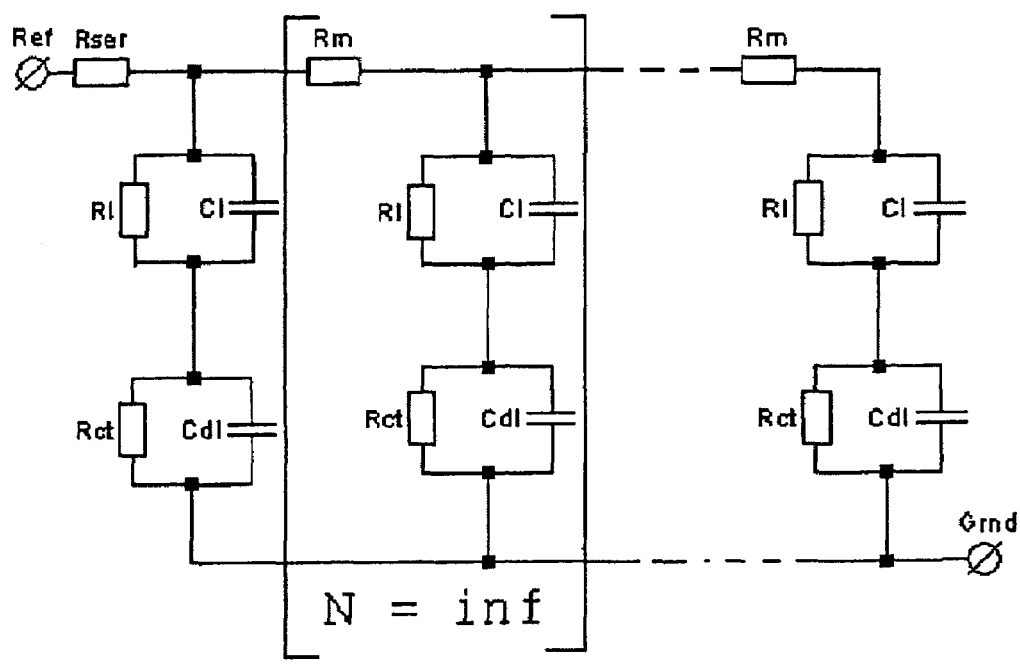
FIG. 7 is a graph showing an equivalent circuit model of impedance spectrum according to an embodiment of the present invention.
Figure 8:
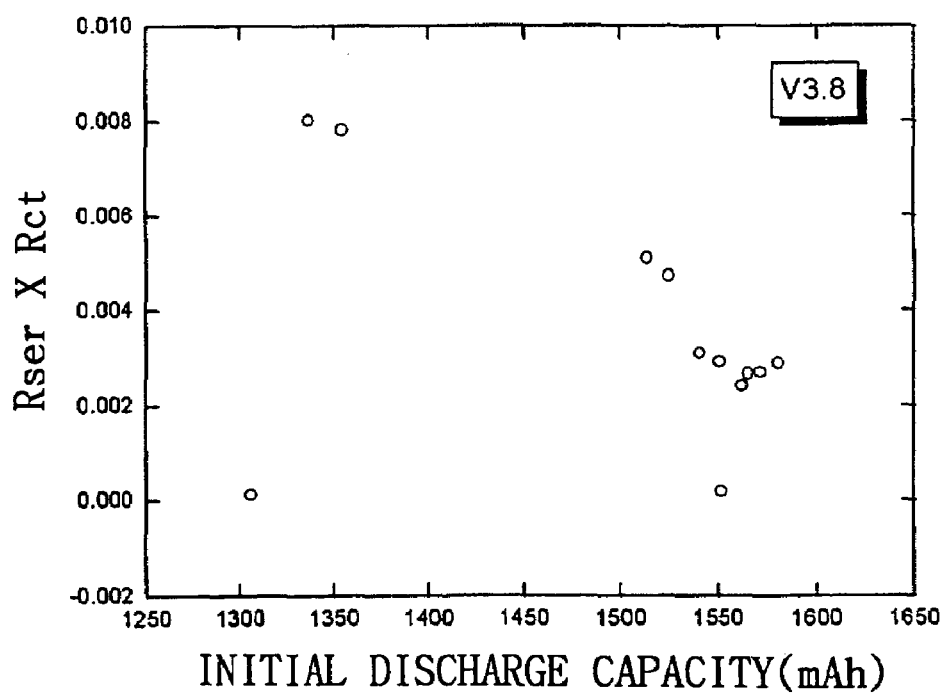
FIG. 8 is a graph showing the correlation of an initial discharge capacity and the product of resistance components $R_{ser}$ and $R_{ct}$ of the equivalent circuit model that is simulated from the impedance spectrum of the battery measured with a charging voltage of 3.8 V according to an embodiment of the present invention.
Figure 9:
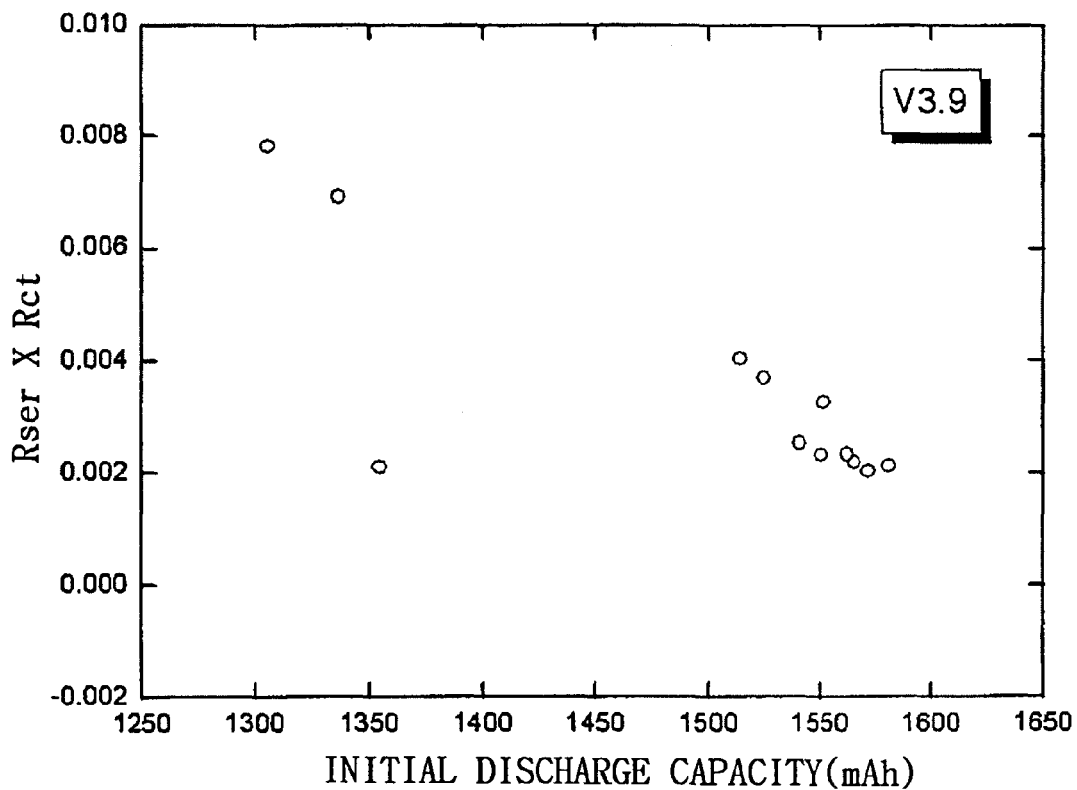
FIG. 9 is a graph showing the correlation of an initial discharge capacity and the product of resistance components $R_{ser}$ and $R_{ct}$ of the equivalent circuit model that is simulated from the impedance spectrum of the battery measured with a charging voltage of 3.9 V according to an embodiment of the present invention.
Figure 10:
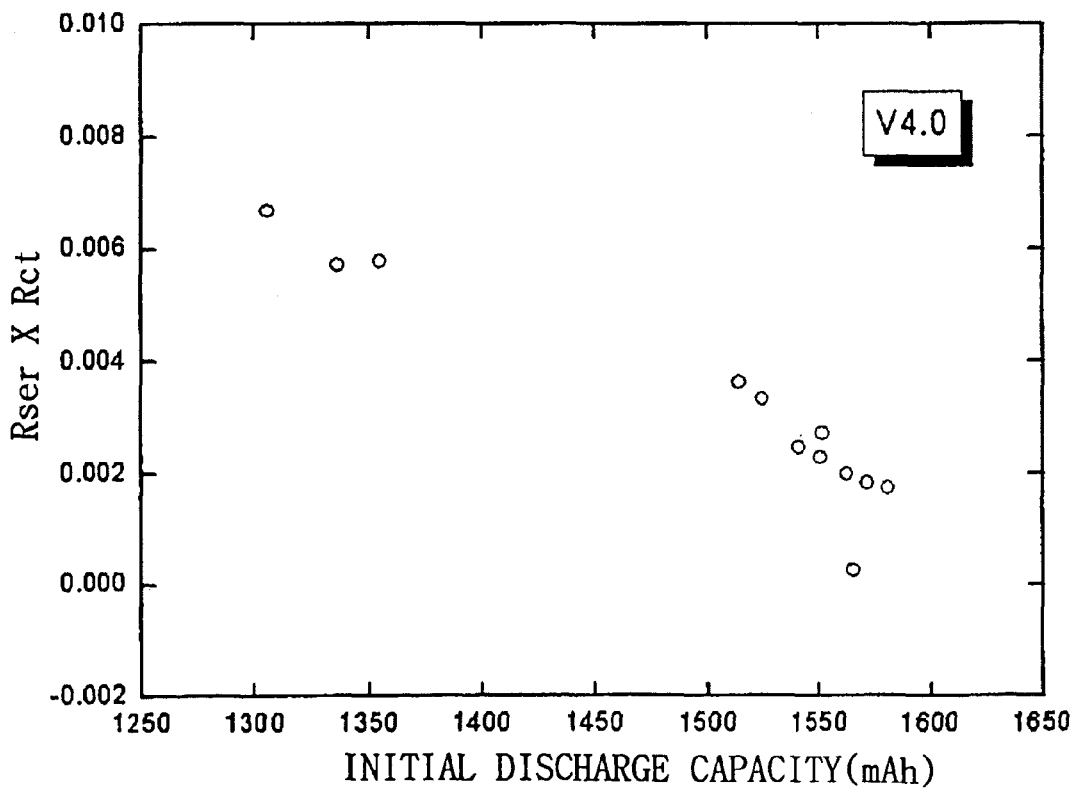
FIG. 10 is a graph showing the correlation of an initial discharge capacity and the product of resistance components $R_{ser}$ and $R_{ct}$ of the equivalent circuit model that is simulated from the impedance spectrum of the battery measured with a charging voltage of 4.0 V according to an embodiment of the present invention.
Figure 11:
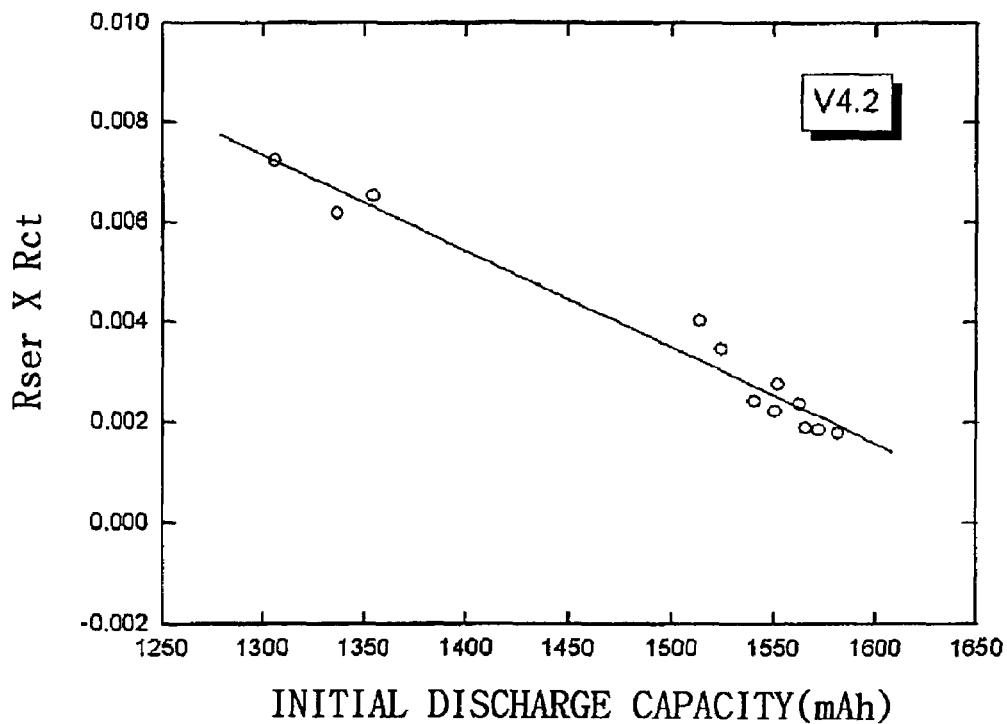
FIG. 11 is a graph showing the correlation of an initial discharge capacity and the product of resistance components $R_{ser}$ and $R_{ct}$ of the equivalent circuit model that is simulated from the impedance spectrum of the battery measured with a charging voltage of 4.2 V according to an embodiment of the present invention.
Figure 12:
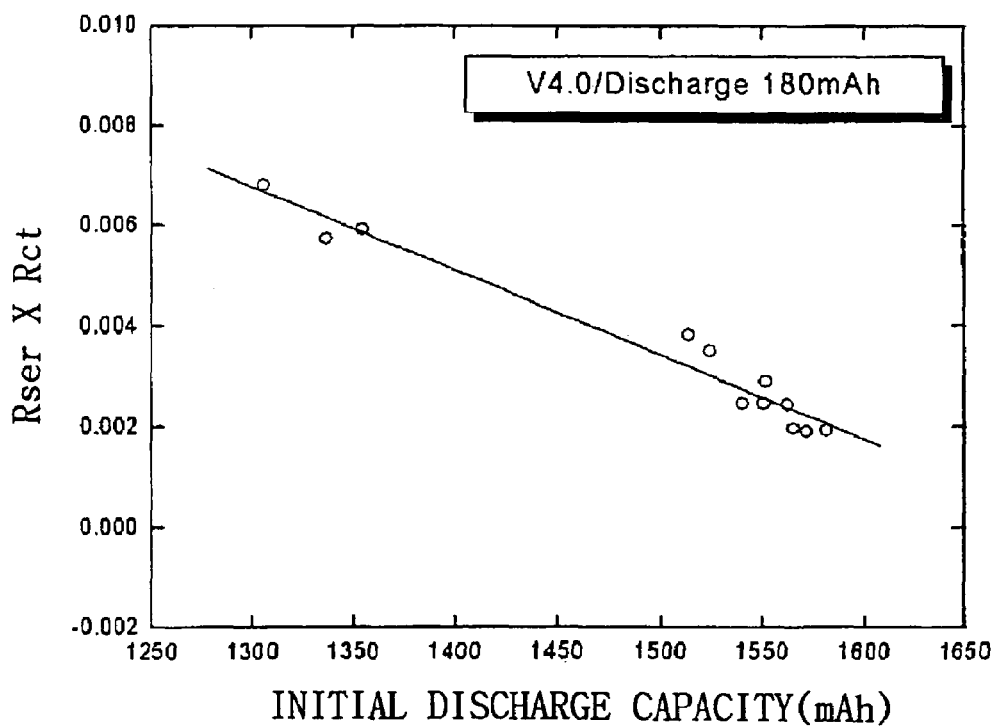
FIG. 12 is a graph showing the correlation of an initial discharge capacity and the product of resistance components $R_{ser}$ and $R_{ct}$ of the equivalent circuit model that is simulated from the impedance spectrum of the battery measured after discharging a charging voltage of 4.0 V by 180 mAh according to an embodiment of the present invention.

Battery groups were prepared independently for a charge termination voltage of 3.8 V, 3.9 V, 4.0 V or 4.2 V in order to make the 12-unit battery groups consisting of 18650-cylindrical lithium-ion secondary batteries in a specified state for impedance spectrum measurement. As for the charge conditions, a current of 900 mA was applied with a constant current CC and a constant voltage CV and the charging process was terminated when the charging current value reached 90 mA. Preferably, the charge was performed with a charge rate of 0.5 C based on the predicted discharge capacity and terminated when the state of charge was 10% of the charging current. Then a discharge current of 1800 mA was applied in the same charge condition until the discharge amount reached 180 mAh. Preferably, the charging process was terminated when the charge voltage was less than 4.15 V and the state of discharge was less than 10% based on the predicted discharge capacity. Immediately after the termination of the partial charge and the discharge, a predetermined voltage drop was applied to the batteries. This voltage drop was largely dependent on the charge termination condition. Accordingly, the impedance spectrum was measured after two hours since the partial charge and the discharge were both terminated. The measurement of impedance spectrum was performed with a BPS 1000FL Model (supplied from Kumho Petrochemical Co., Ltd.) in the frequency range between 10 kHz and 10 mHz, the results are presented in FIGS. 2 to 6. The measuring conditions were referred to U.S. Pat. No. 6,208,147. The equivalent circuit model fitted from the spectrum impedance measurement was a generic circuit model that includes model parameters of nonlinear resistors, nonlinear capacitors and nonlinear transfer lines as suggested by the applicant of this patent. The equivalent circuit model is illustrated in FIG. 7 (J. Power Sources, 83 (1999) 61). The resistance component of the $R_{ser}$ (Resistance of separator and current collectors) obtained from the impedance spectrum model and the $R_{ct}$ (Charge transfer resistance) value corresponding to charge transfer resistance components were subjected to mathematical multiplication. Then a capacity correlation graph was derived from the relationship equation of the resulting operation value and the initial discharge capacity measured by a discharge with a discharge rate of 1.0 C after the measurement of the impedance spectrum. The results are presented in FIGS. 8 to 12. With the charge voltage of less than 4.0 V, that is, when the charge rate was less than 50%, the operation value was frequently deviated from the correlation with the initial discharge capacity. The battery group with a high charge termination voltage of 4.2 V and the batteries subjected to partial discharge with a voltage of 4.0 V had a high capacity correlation.

As described above, the present invention provides an economical method for evaluating an initial discharge capacity by mathematically operating characteristic resistance components of an equivalent circuit model fitted from an impedance spectrum and selecting batteries of a different initial discharge characteristic, thereby allowing the battery manufacturer to use an economical method for precisely evaluating an initial discharge capacity of batteries of the same group and maximizing the energy efficiency of the batteries for the users of a battery group consisting of batteries in series, parallel or series-parallel arrangement.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for evaluating a capacity of secondary batteries of a same group produced under same conditions, the method comprising:
    (a) partially charging the secondary batteries to have a charge capacity of at least 60% with a voltage less than a full charge voltage;
    (b) measuring an impedance spectrum for the batteries partially charged;
    (c) determining specific internal resistance components from an equivalent circuit model fitted from the measured impedance spectrum to perform a numerical operation; and
    (d) comparing the numerical operation value of the resistance components with an initial discharge capacity graph of the batteries to evaluate an initial discharge capacity of unknown batteries of the same group.

2. The method as claimed in claim 1, wherein the impedance spectrum is measured in a frequency range of 10 mHz to 10 kHz.

3. The method as claimed in claim 1, wherein the equivalent circuit model used for simulation of the impedance spectrum comprises model parameters of nonlinear resistors, nonlinear capacitors, and nonlinear transfer lines.

4. The method as claimed in claim 3, wherein the internal resistance components obtained from the equivalent circuit model include resistance components and charge transfer resistance components related to one of a degradation of an electrolyte, a separator, and a current collector.

5. The method as claimed in claim 1, wherein the discharge capacity graph is a capacity correlation graph obtained from a relationship equation with the initial discharge capacity determined after a discharge performed with a discharge rate of 1.0 C.

6. The method as claimed in claim 1, wherein the secondary battery includes at least one of a lithium ion battery, a lithium polymer battery, a Ni—Cd battery, and a NiMH battery.

7. A method for evaluating a capacity of secondary batteries of a same group produced under same conditions, the method comprising:
    (a) partially discharging the secondary batteries to a discharge capacity of less than 10% from a voltage less than the full charge voltage;
    (b) measuring an impedance spectrum for the batteries partially discharged;

(c) determining specific internal resistance components from an equivalent circuit model fitted from the measured impedance spectrum to perform a numerical operation; and (d) comparing the numerical operation value of the resistance components with an initial discharge capacity graph of the batteries to evaluate an initial discharge capacity of unknown batteries of the same group.

8. The method as claimed in claim 7, wherein the impedance spectrum is measured in a frequency range of 10 mHz to 10 kHz.

9. The method as claimed in claim 7, wherein the equivalent circuit model used for simulation of the impedance spectrum comprises model parameters of nonlinear resistors, nonlinear capacitors, and nonlinear transfer lines.

10. The method as claimed in claim 9, wherein the internal resistance components obtained from the equivalent circuit model include resistance components and charge transfer resistance components related to one of a degradation of an electrolyte, a separator, and a current collector.

11. The method as claimed in claim 7, wherein the discharge capacity graph is a capacity correlation graph obtained from a relationship equation with the initial discharge capacity determined after a discharge performed with a discharge rate of 1.0 C.

12. The method as claimed in claim 7, wherein the secondary battery includes at least one of a lithium ion battery, a lithium polymer battery, a Ni—Cd battery, and a NiMH battery.

* * * * *